(12) United States Patent
Kawaguchi

(10) Patent No.: US 6,753,539 B2
(45) Date of Patent: Jun. 22, 2004

(54) ION IMPLANTATION APPARATUS EQUIPPED WITH PLASMA SHOWER AND ION IMPLANTATION METHOD

(75) Inventor: Hiroshi Kawaguchi, Toyo (JP)

(73) Assignee: Sumitomo Eaton Nova Corporation, Tokyo (JP)

(*) Notice: Subject to any disclaimer, the term of this patent is extended or adjusted under 35 U.S.C. 154(b) by 0 days.

(21) Appl. No.: 10/372,965

(22) Filed: Feb. 26, 2003

(65) Prior Publication Data

US 2003/0160190 A1 Aug. 28, 2003

(30) Foreign Application Priority Data

Feb. 28, 2002 (JP) ........................................ 2002/052884

(51) Int. Cl.[7] .............................................. H01J 37/317
(52) U.S. Cl. ................ 250/492.21; 250/251; 250/492.3
(58) Field of Search .......................... 250/492.21, 251, 250/492.3

(56) References Cited

U.S. PATENT DOCUMENTS 5,399,871 A * 3/1995 Ito et al. ................. 250/492.21
5,903,009 A * 5/1999 Bernstein et al. ........ 250/492.21
6,271,529 B1 * 8/2001 Farley et al. ............ 250/492.21
6,313,428 B1   11/2001 Chen et al.

FOREIGN PATENT DOCUMENTS

| GB | 2 255 225 | 10/1992 |
| JP | 3-194841 | 8/1991 |
| JP | 8-96743 | 4/1996 |

OTHER PUBLICATIONS

Search Report dated Oct. 6, 2003.

* cited by examiner

Primary Examiner—Nikita Wells
(74) Attorney, Agent, or Firm—Arent Fox, PLLC

(57) ABSTRACT

In an ion implantation method of the present invention, an ion beam extracted from an ion source is implanted into a wafer by way of a plasma shower in a transportation section on the upstream side of the wafer. The plasma shower comprised of an arc chamber and a shower tube is arranged in a resolving aperture member or in the immediate vicinity of the downstream side.

32 Claims, 7 Drawing Sheets

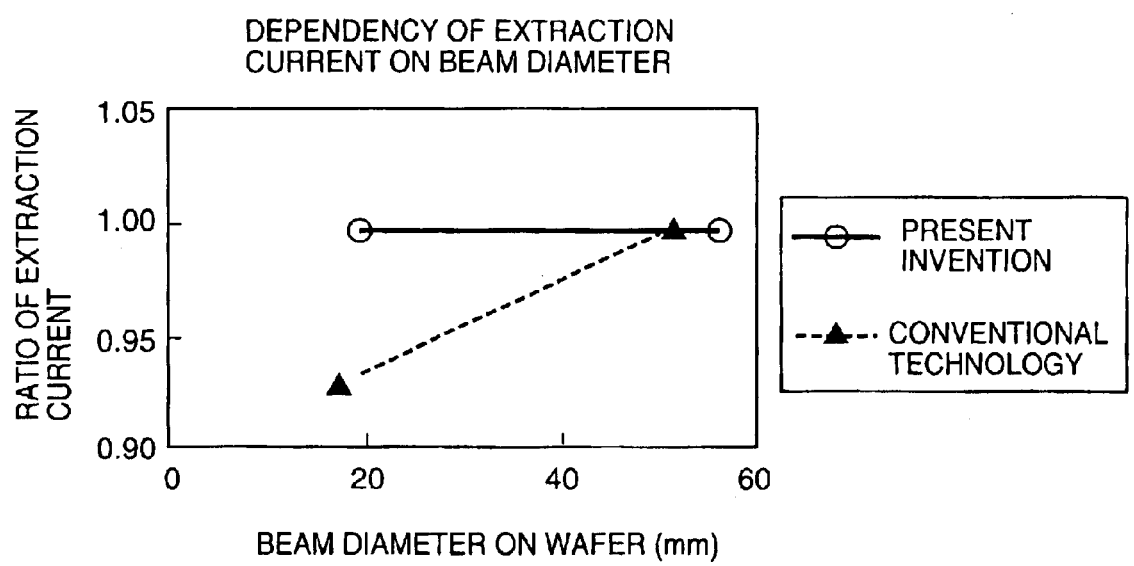

ION IMPLANTATION APPARATUS EQUIPPED WITH PLASMA SHOWER AND ION IMPLANTATION METHOD

BACKGROUND OF THE INVENTION

1. Field of the Invention

The present invention relates to an ion implantation apparatus and an ion implantation method.

2. Description of the Related Art

The following will describe a typical configuration of an ion implantation apparatus with reference to FIG. 1. In FIG. 1, ions are extracted as an ion beam 52 by an extraction electrode 51 from an ion source 50. The extracted ions are analyzed by a mass analysis magnet 53 and a resolving aperture member 54 and a required ion species is selected. The selected ions are implanted into a wafer 55. The resolving aperture member 54 serves as a mass analysis slit. On a beam line, a shower tube 56 for showering plasma is arranged between the resolving aperture member 54 and the wafer 55. The shower tube 56 is mounted with an arc chamber 57. The arc chamber 57 has an opening therein which faces the beam line side. A Faraday cup 58 for use in measurement of a beam current is provided in such a manner that it can advance onto and retreat from the beam line. That is, the Faraday cup 58 is placed on the beam line when the ion beam is set up (as indicated by a dash-and-dot line in FIG. 1) and placed off from the beam line at the position of a solid line in FIG. 1 when the ions are being implanted. On the back side of the wafer 55, a Faraday cup 59 is arranged so that measurement may be possible during ion implantation.

FIG. 2 is an enlarged view for showing the downstream side of the resolving aperture member 54 in FIG. 1. Although not shown in FIG. 1, components shown in FIG. 1 are arranged in a vacuum chamber 60 as shown in FIG. 2. The arc chamber 57 incorporates therein a filament 57-1. To the filament 57-1 are there connected a filament power source 57-2 and an arc power source 57-3. Furthermore, the arc chamber 57 is arranged in such a manner that a predetermined gas can be introduced into it from a gas supply system 57-4. The shower tube 56, the arc chamber 57, and the arc power source 57-3 are each connected to the ground. In this configuration, in the immediate vicinity of the downstream side of the resolving aperture member 54 is there arranged at least one aperture member 61. The Faraday cup 58 can be advanced onto and retreated from the beam line by a drive device 63 which is mounted outside the vacuum chamber 60.

The following will describe a method of extraction of electrons from the plasma shower. The electrons are specifically extracted from the plasma shower as follows.

(1) Generation of Arc

When a large current is flown through the filament 57-1, the filament 57-1 is heated to 2000° C. or higher, to emit thermions. The arc chamber 57 is supplied with a gas such as Ar from the gas supply system 57-4 and also supplied with an arc voltage of a few tens of volts with respect to the filament 57-1. Then, the thermions are accelerated to collide with atoms of the gas, thus generating new thermions. This electron amplification action generates plasma between the filament 57-1 and the arc chamber 57.

(2) Extraction of Electrons by Use of Beam Potential

When an ion beam passes by outside the opening in the arc chamber 57 in a condition where plasma is being generated stably in the arc chamber 57, a positive potential of the ion beam extracts electrons from the plasma which is present in the arc chamber 57. These extracted electrons are accelerated toward the ion beam. These electrons collide with neutral gas atoms which have not been ionized in the arc chamber 57 and ejected through the opening in the arc chamber 57, thus generating plasma again between the arc chamber 57 and the ion beam. This is called a plasma bridge (which is indicated by a reference numeral 65) and has an effect of supplying the ion beam with such a quantity of electrons as to exceed a space charge limited current.

Next, characteristics of extraction of electrons from a plasma shower are described. For example, if the magnitude of a beam current increases, the positive potential of the ion beam increases. As a result, the quantity of electrons which are extracted from the arc chamber 57 increases, thus increasing also the quantity of electrons which are supplied to the ion beam. By such autonomous control, in a plasma shower system, electrons which are abundant enough to neutralize the positive charge of the ion beam are extracted from the plasma shower, thus restraining the positive charging of the wafer 55. That is, the plasma shower system comprised of the shower tube 56 and the arc chamber 57 serves as a charge neutralization apparatus which is for restraining charge.

The following will describe various problems of the above-mentioned conventional technologies.

(1) Effects of Ion Beam Diameter

An ion implantation apparatus employs an ion beam of a variety of ion species, energy levels, and beam currents. The diameter of such an ion beam varies with beam conditions and beam generating conditions.

The arc chamber 57 is mounted at such a position that it may not be collided with an ion beam which has the maximum design diameter. This is done so in order to prevent such a problem from occurring that the beam current would decrease or particles would be generated if the ion beam collides with the arc chamber 57.

If a beam diameter D1 varies at the position of the arc chamber 57, a distance between the opening in the arc chamber 57 and the ion beam also varies and hence the magnitude of an electric field varies. Accordingly, if the beam diameter D1 varies, the quantity of electrons which are supplied to the ion beam varies. For example, if such beam conditions are applied that the beam diameter D1 is liable to decrease, there occurs an insufficiency in quantity of electrons which are supplied from the plasma shower, thus making it impossible to sufficiently suppress positive charging of the wafer 55 in some cases. In order to solve this problem, there may be considered such a method as to vary the power of the plasma shower corresponding to the beam diameter D1. This method, however, requires for its implementation a beam diameter measurement mechanism, a feedback circuit, etc., thus complicating the plasma shower system more than necessary.

(2) Effects of Position of the Arc Chamber 57

The plasma shower is normally arranged on the downstream side of the resolving aperture member 54 where the ion beam is converged, for example, between the wafer 55 and a suppression electrode, that is, the aperture member 61. The plasma shower, however, may be arranged in some cases in the immediate vicinity the wafer 55 so that the wafer may be supplied with electrons easily.

As is clear from FIG. 2, a variation d1 in value of the beam diameter D1 at the position of the plasma shower increases as the plasma shower becomes more distant from the resolving aperture member 54 in a beam axial direction. Accordingly, as the distance between the arc chamber 57 and the ion beam increases in a condition where the arc chamber 57 is separated from the resolving aperture member 54, the quantity of electrons which are supplied from the plasma shower becomes insufficient, thus making it impossible to suppress positive charging of the wafer 55 in some cases.

Next, the Faraday cup 58 is described.

(1) Device Layout Along the Beam Line

As described above, on the downstream side of the resolving aperture member 54 is there arranged the Faraday cup 58 to measure a beam current when the ion beam is set up. The Faraday cup 58 is intended to monitor the beam current, to adjust ion source parameters, thus obtaining a desired ion beam. Furthermore, on the downstream side of the Faraday cup 58, that is, between the Faraday cup 58 and the wafer 55 is there arranged the shower tube 56 to shower plasma, which serves as a charge neutralization apparatus.

When the ion beam is set up completely, the Faraday cup 58 is moved off from the beam line. Then, the ion beam passes through the plasma shower and is transported to the wafer 55, where the ions are implanted into the wafer 55.

It is to be noted that after passing through the resolving aperture member 54, the ion beam diverges. For this reason, as the distance between the resolving aperture member 54 and the wafer 55 increases, the ion beam comes to collide with the shower tube 56 etc., thus being lost more. This loss increases particularly with a low energy beam, thus leading to such a problem in some cases that a throughput may decrease owing to a decrease in the magnitude of the beam current or the ion beam may collide with the shower tube 56 etc.

One of the factors for an elongated distance between the resolving aperture member 54 and the wafer 55 is a problem of an arrangement of the Faraday cup 58 in the beam line. The Faraday cup 58 is moved in such a manner that it may be used only when the ion beam is being set up and, during ion implantation, be moved off from the beam line. The region in the beam line in which the Faraday cup 58 exists becomes a blank when the ions being implanted, thus elongating the beam line.

SUMMARY OF THE INVENTION

In view of the above, it is an object of the present invention to provide an ion implantation apparatus and method which can avoid extraction of electrons from a plasma shower from being influenced by a variation in ion beam diameter.

It is another object of the present invention to provide an ion implantation apparatus and method which can suppress loss of an ion beam particularly at a low energy level.

In an ion implantation method to which the present invention is applied, when an ion beam extracted from a ion source is transported to be implanted into a processing-subject substrate, the ion beam is caused to pass through a charge neutralization section in a transportation section on the upstream side of the processing-subject substrate.

An ion implantation method according to an aspect of the present invention features that an ion beam is neutralized by a charge neutralization section at such a position that it is brought nearest the ion beam.

This position which is nearest the ion beam in the present ion implantation method is intended to be such a position that the beam diameter may be smallest there or to be in the immediate vicinity of the downstream side of the position.

In the present ion implantation method, the position which is nearest the ion beam is intended to be a position in the immediate vicinity of the downstream side of a position where the beam diameter becomes smallest and also the position of the charge neutralization section is intended to be variable corresponding to the beam diameter.

In the present ion implantation method, furthermore, on the upstream side of the charge neutralization section is there arranged a resolving aperture member for converging and diverging a beam. Accordingly, the position in the immediate vicinity of the downstream side of a position where the beam diameter becomes the smallest is intended to be on the downstream side of the resolving aperture member.

In the present ion implantation method, furthermore, the charge neutralization section includes a shower tube and an arc chamber combined therewith. A length of the shower tube is made shorter in a beam axis direction.

In the present ion implantation method, furthermore, the shower tube has a minimum required inner diameter.

In the present ion implantation method, furthermore, along a beam line between the shower tube and a processing-subject wafer may there be arranged an intermediate tube in such a manner as to continue to the shower tube.

In the present ion implantation method, furthermore, the arc chamber may be variable in position in a direction perpendicular to a beam axis corresponding to a beam diameter or intensity.

In the present ion implantation method, furthermore, the arc chamber may be variable in position in the beam axis direction corresponding to a beam diameter or intensity, so as to be arranged nearest the ion beam.

In the present ion implantation method, furthermore, the diameter of the shower tube may be variable corresponding to a beam shape, position, or size.

In the present ion implantation method, furthermore, the length of the shower tube may be variable corresponding to a beam shape, position, or size.

In the present ion implantation method, furthermore, the shower tube may be variable in position in the beam axis direction corresponding to a beam shape, position, or size.

In the present ion implantation method, furthermore, a beam measurement portion may be arranged in a transportation section on the upstream side of a processing-subject substrate. In this case, the beam measurement portion and the charge neutralization section may be interchangeable at the same position on the beam line.

In the present ion implantation method, furthermore, on the upstream side of the charge neutralization section may there be arranged the beam convergence/resolution resolving aperture member. Accordingly, the position which is nearest the ion beam may be present in the resolving aperture member. In this case, on the downstream side of the resolving aperture member is there provided a beam measurement portion in such a manner that it can advance onto and retreat from the beam line. In this case, furthermore, on the downstream side of the resolving aperture member may there be arranged an intermediate tube.

In an ion implantation apparatus to which the present invention is applied, when an ion beam extracted from a ion source is transported to be implanted into a processing-subject substrate, the ion beam is caused to pass through a charge neutralization section in a transportation section on the upstream side of the processing-subject substrate.

The ion implantation apparatus according to an aspect of the present invention features that the charge neutralization section is arranged at a position which is nearest the ion beam.

In the present ion implantation apparatus, the position which is nearest the ion beam is intended to be such a position that the beam diameter may be smallest there or to be its immediate vicinity of the downstream side of the position.

In the present ion implantation apparatus, the position which is nearest the ion beam is intended to be such a position in the immediate vicinity of the downstream side that the beam diameter may be the smallest. Furthermore, the present ion implantation apparatus is provided with a drive unit which makes the position of the charge neutralization section variable corresponding to the beam diameter.

In the present ion implantation apparatus, furthermore, on the upstream side of the charge neutralization section is there arranged the resolving aperture member for converging and diverging the ion beam. Accordingly, the position in the immediate vicinity of the downstream side of a position where the beam diameter becomes the smallest is intended to be on the downstream side of the resolving aperture member.

In the present ion implantation apparatus, furthermore, the charge neutralization section includes the shower tube and the arc chamber combined therewith. A length of the shower tube is made shorter in a beam axis direction.

In the present ion implantation apparatus, furthermore, the shower tube has a minimum required inner diameter.

In the present ion implantation apparatus, furthermore, along a beam line between the shower tube and a processing-subject wafer may there be arranged the intermediate tube in such a manner as to continue to the shower tube.

In the present ion implantation apparatus, furthermore, the drive unit includes a drive mechanism which makes variable the position of the arc chamber in the direction perpendicular to the beam axis corresponding to the beam diameter or intensity.

In the present ion implantation apparatus, furthermore, the drive unit includes a drive mechanism which makes variable the position of the arc chamber in the same direction as the beam axis direction corresponding to the beam diameter or intensity. In this case, the arc chamber can be arranged at a position which is nearest the ion beam.

In the present ion implantation apparatus, furthermore, the shower tube may be comprised of at least two members which are divided in the same direction as the beam axis direction. In this case, one of these at least two divided members has a cross section which is a little smaller than that of the other. The drive unit may include a drive mechanism which makes variable the diameter of the shower tube by bringing these two divided members close to or separate them from each other corresponding to the beam shape, position, or size.

In the present ion implantation apparatus, furthermore, the shower tube may be comprised of at least two members which are divided in a direction perpendicular to the beam axis. In this case, one of these at least two divided members has a diameter which is a little smaller than that of the other. The drive portion may include a drive mechanism which makes variable the length of the shower tube by moving at least one of these two divided members in the beam axis direction corresponding to the beam shape, position, or size.

In the present ion implantation apparatus, furthermore, the drive unit may include a drive mechanism which makes variable the position of the shower tube in the same direction as the beam axis direction corresponding to the beam shape, position, or size.

In the present ion implantation apparatus, furthermore, the beam measurement portion may be arranged in a transportation section on the upstream side of a processing-subject substrate. Moreover, an interchanging drive device is provided which makes it possible to interchange the beam measurement portion and the charge neutralization section with each other at the same position on the beam line.

In the present ion implantation apparatus, furthermore, on the upstream side of the charge neutralization section is there arranged the beam convergence/resolution resolving aperture member. In this case, the position which is nearest the ion beam may be present in the resolving aperture member. In this case, on the downstream side of the resolving aperture member may there be provided a beam measurement portion in such a manner that it can advance onto and retreat from the beam line. In this case, furthermore, on the downstream side of the resolving aperture member may there be arranged the intermediate tube.

BRIEF DESCRIPTION OF THE DRAWINGS

FIG. 7 is a characteristic graph for explaining dependency of an extraction current on a beam diameter in the ion implantation apparatus.

DESCRIPTION OF THE PREFERRED EMBODIMENTS

The present invention has took notice of a fact that a variation d in beam diameter becomes smaller as it comes closer to a beam convergence position. In an ion implantation apparatus according to the present invention, an arc chamber for plasma showering is arranged in a resolving aperture member where an ion beam is converged or in the immediate or immediate vicinity thereof and on its downstream side. As a result, the quantity of electrons which are supplied from a plasma shower to an ion beam is not influenced by a variation in beam diameter.

Figure 1:
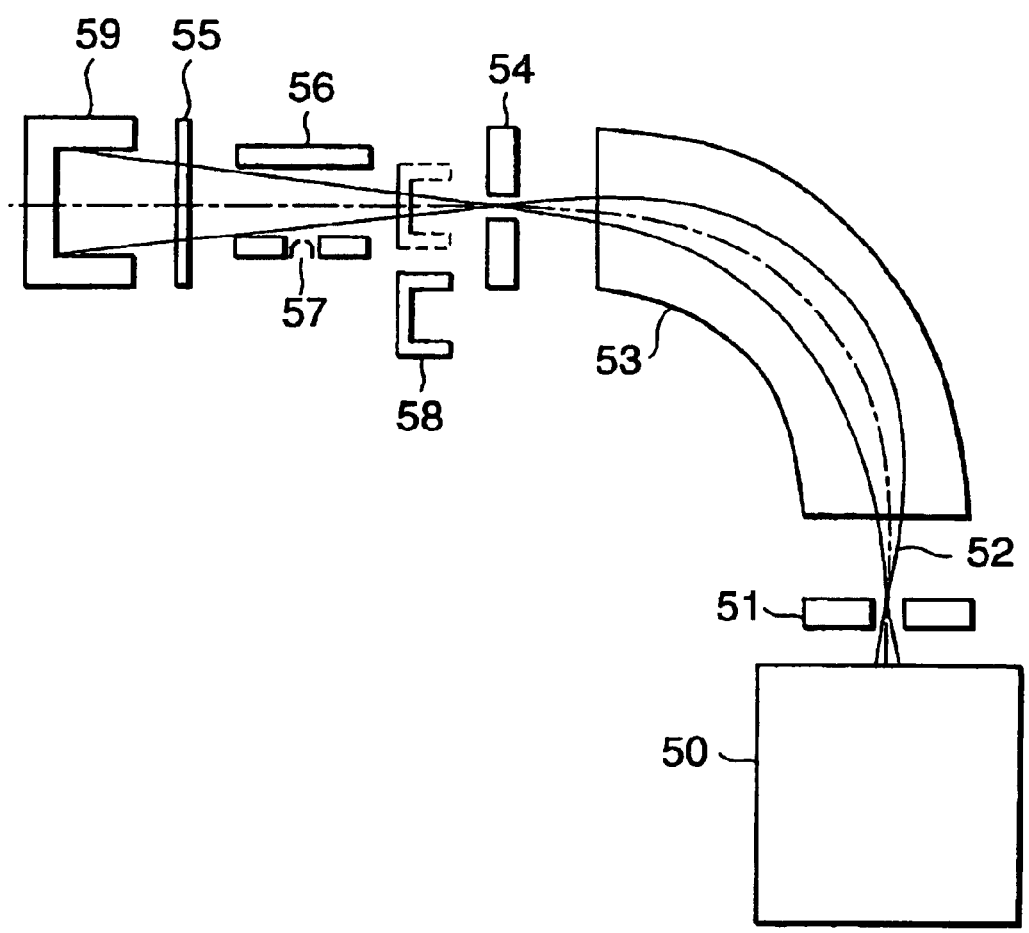
FIG. 1 is an illustration for showing a typical configuration of an ion implantation apparatus.
Figure 2:
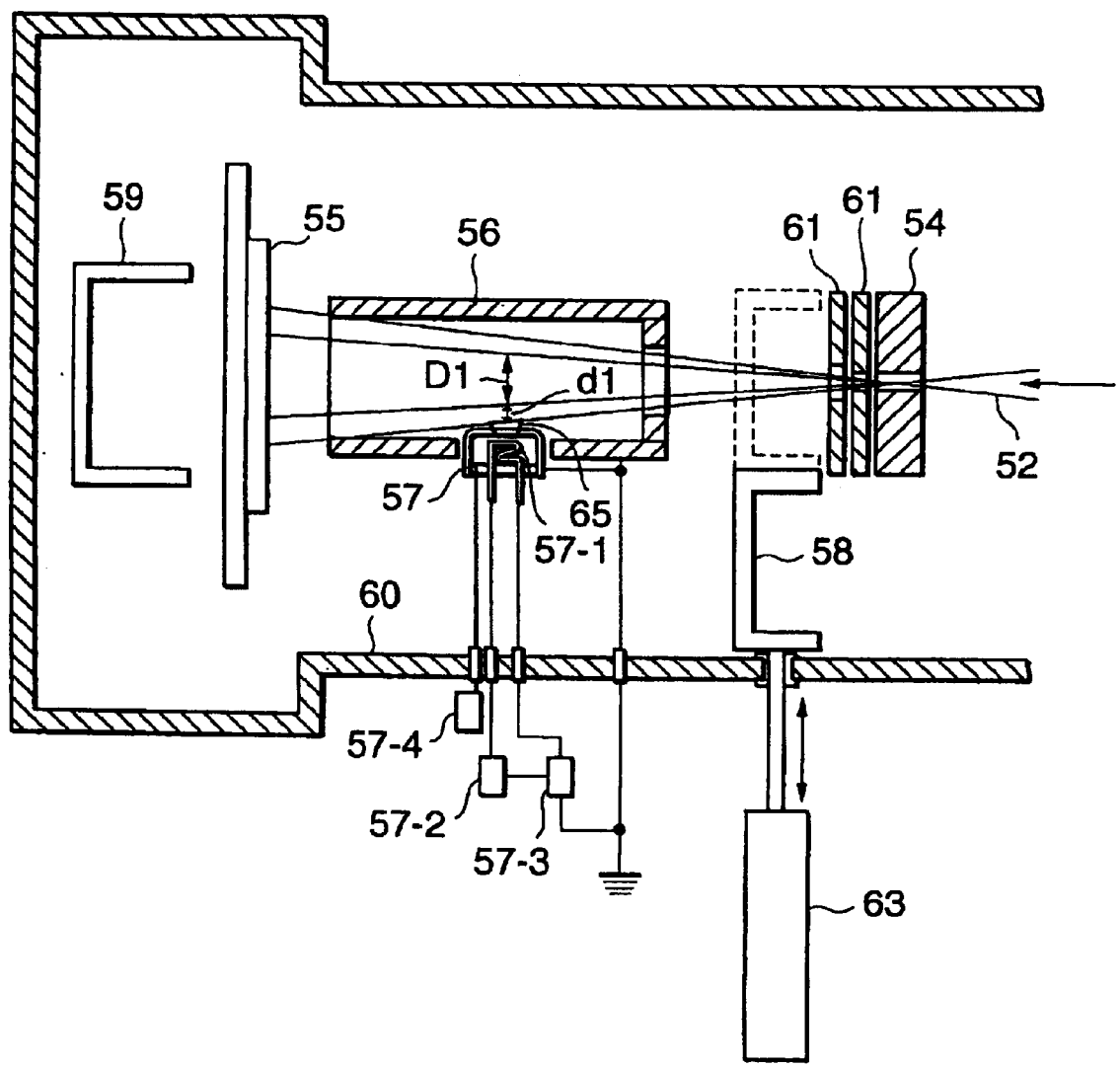
FIG. 2 is an enlarged view for showing a configuration of the apparatus of FIG. 1 on the downstream side of a resolving aperture member.
Figure 3:
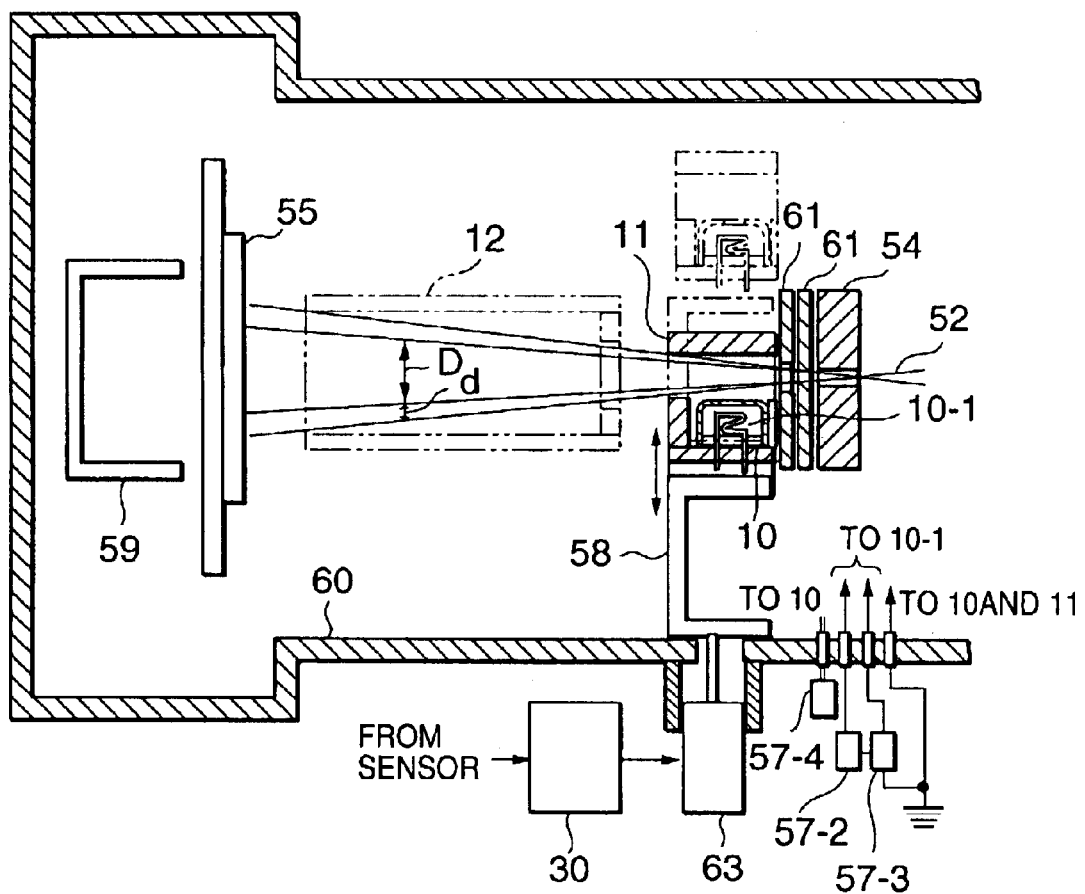
FIG. 3 is an illustration for showing a configuration of an ion implantation apparatus according to a first embodiment of the present invention on the downstream side of a resolving chamber.

The following will describe an ion implantation apparatus according to a first embodiment with reference to FIG. 3. In FIG. 3, components having the same functions as those shown in FIG. 2 are indicated by the same reference numerals as those in FIG. 2. A configuration on the upstream side of a resolving aperture member 54 is the same as that shown in FIG. 1.

In FIG. 3, ions are extracted as an ion beam 52 by an extraction electrode from an ion source. The extracted ions are analyzed by a mass analysis magnet and a resolving aperture member 54 and a required ion species is selected. The selected ions are implanted into a wafer 55. After passing through the resolving aperture member 54, the ion beam has an increasingly larger diameter. The variation d in value of a beam diameter D becomes smaller as the beam comes closer to the resolving aperture member 54.

It is not easy to mount the arc chamber in the resolving aperture member because, for example, there is an aperture member 61 such as a suppression electrode to block electrons on the downstream side of the resolving aperture member 54. For this reason, in the present embodiment, an arc chamber 10 is mounted directly near the resolving aperture member 54 on its downstream side, in this case, directly near the aperture member 61 on its downstream side, thus bringing an opening in the arc chamber 10 and an ion beam close to each other. The ion beam has a higher potential immediately after it has passed through the resolving aperture member 54 than when it is present in it. This makes it easy to extract of electrons from the arc chamber 10.

In this case, a shower tube 11 to be combined with the arc chamber 10 has a smaller beam axial length than a conventional shower tube 56 (see FIG. 2). This is done so in order to prevent the ion beam from colliding with the shower tube 11 when the arc chamber 10 and the ion beam are brought close to each other appropriately. Furthermore, the shower tube 11 is intended to have a small aperture diameter for a beam line than the conventional shower tube 56.

In the present embodiment, furthermore, a Faraday cup 58 and a combination of the arc chamber 10 and the shower tube 11 are intended to be able to be interchanged with each other on the beam line by an interchange drive device 63. That is, when the ion beam is set up, the combination of the arc chamber 10 and the shower tube 11 is intended to be moved off from the beam line so that the Faraday cup 58 may be placed on the beam line instead. When ions are being implanted, on the other hand, as shown in FIG. 3, the Faraday cup 58 is intended to be moved off from the beam line so that the combination of the arc chamber 10 and the shower tube 11 may be placed on the beam line instead. Therefore, the Faraday cup 58 and the combination of the arc chamber 10 and the shower tube 11 are moved integrally with each other by the interchange drive device 63. The interchange drive device 63 may be either of a motor-driving type or a hydraulic-driving type.

It is to be noted that FIG. 3 is a cross-sectional plan view. Although in the present embodiment, the Faraday cup 58 and the combination of the arc chamber 10 and the shower tube 11 are arranged to move horizontally along a guide member (not shown) such as a guide rail, they may be arranged to move vertically. In this case, FIG. 3 might be viewed as a cross-sectional side view.

As described above, it is not necessary to fix the positions of the arc chamber 10 and the shower tube 11. As described below, therefore, the distance between the opening in the arc chamber 10 and the ion beam can be reduced more easily rather by making variable the position of the arc chamber 10, the length of the shower tube 11, and even the opening diameter of the shower tube corresponding to the beam diameter or intensity.

Figure 4:
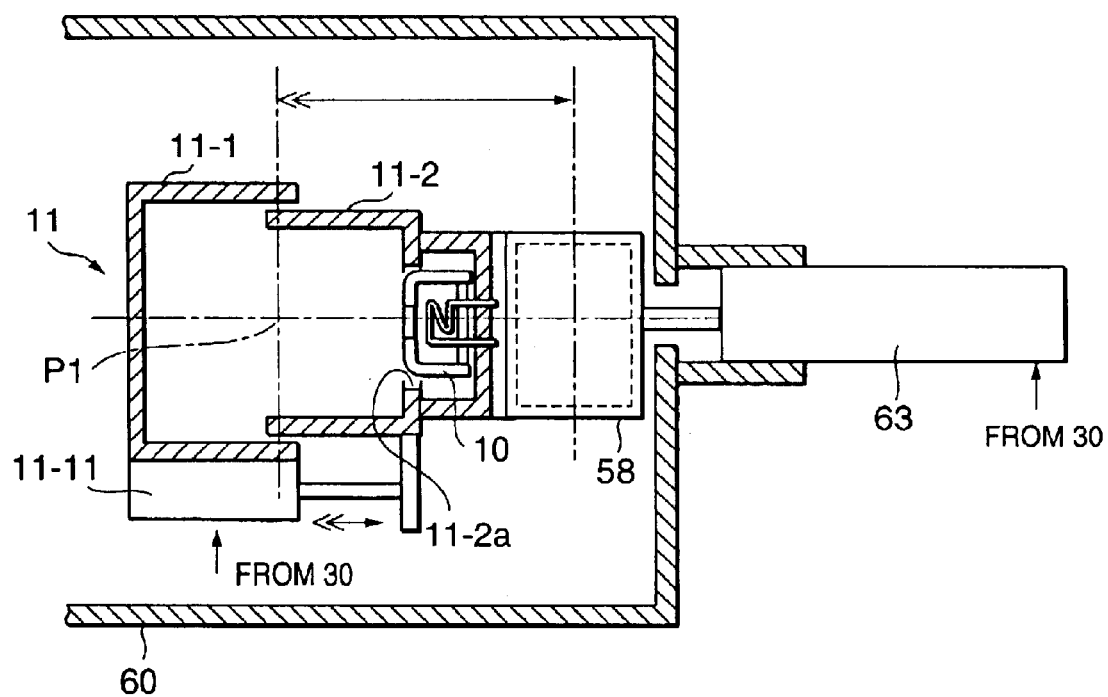
FIG. 4 is an illustration for explaining a first example of a moving aspect of movable shower tube and arc chamber in the ion implantation apparatus shown in FIG. 3.

The shower tube 11 shown in FIG. 4 is a cylindrical body comprised of two divided members of a roughly U-shaped first member 11-1 and a little smaller second member 11-2 having the same shape in section. The second member 11-2 is provided with an opening 11-2a formed therein. The arc chamber 10 is mounted on a side of the shower tube 11 so that the inside of the shower tube 11 may be viewed from the opening in the arc chamber 10 through this opening 11-2a. The first member 11-1 and the second member 11-2 can be moved by a first drive mechanism 11-11 relatively to each other in a horizontal direction perpendicular to a beam axis P1. FIG. 4 shows relative positions of the first and second members 11-1 and 11-2 in a case where the beam diameter is largest. Since the position of the beam axis P1 is invariable, it is necessary to move the first member 11-1 and the second member 11-2 by the same distance. When the beam diameter is small, the first drive mechanism 11-11 moves the first member 11-1 and the second member 11-2 relatively to each other in such a manner that an opening formed between these may become small. If the beam diameter is large, on the other hand, the first drive mechanism 11-11 moves the first member 11-1 and the second member 11-2 relatively to each other in such a manner that the opening formed between these may become large.

It is to be noted that of course the shower tube 11 shown in FIG. 4 may be used in such an aspect that these may be rotated by 90 degrees, that is, the arc chamber 10 may be positioned on the lower side or the upper side. In this case, the first member 11-1 and the second member 11-2 are driven upward and downward respectively. Furthermore, preferably the first drive mechanism 11-11 is driven as interlocked with the interchange drive device 63 by a controller 30 (see FIG. 3).

Figure 5:
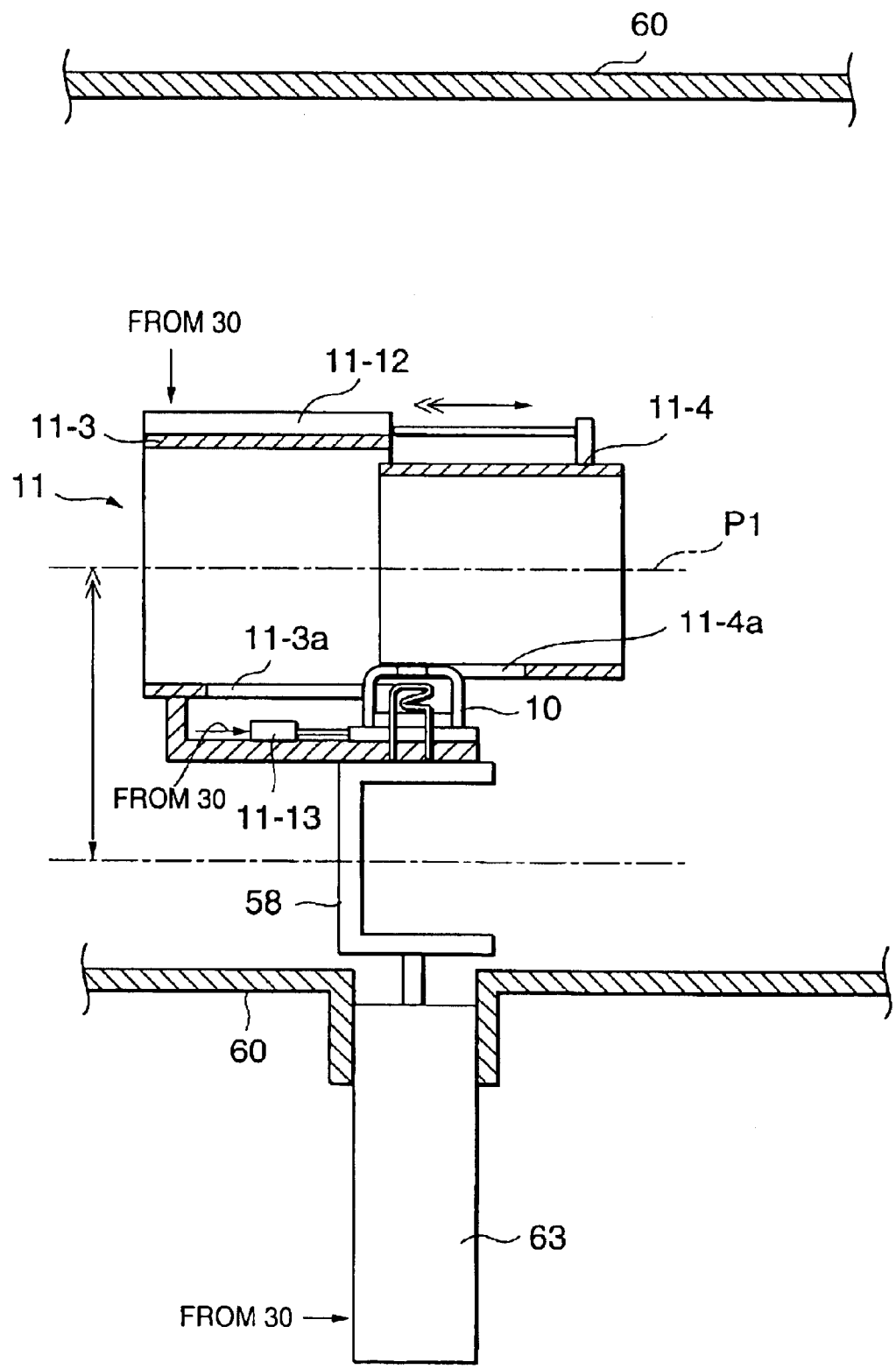
FIG. 5 is an illustration for explaining a second example of the moving aspect of the movable shower tube and arc chamber in the ion implantation apparatus shown in FIG. 3.

The shower tube 11 shown in FIG. 5 is comprised of two divided members of a cylindrical first member 11-3 and a cylindrical second 11-4 having a little smaller diameter. In the sides of the first member 11-3 and the second member 11-4 are there respectively formed notches 11-3a and 11-4a through which the inside of the shower tube 11 can be viewed from the opening in the arc chamber 10. That is, the arc chamber 10 is mounted on the side of the shower tube 11. As in FIG. 5, however, the arc chamber 10 may be mounted on the upper side or the lower side of the shower tube 11.

The first member 11-3 and the second member 11-4 can be moved by a second drive mechanism 11-12 relatively to each other in the same direction. Furthermore, in this example, the arc chamber 10 can be driven by a third drive mechanism 11-13 in the same direction as the beam axis. Of course the arc chamber 10 may be intended to be able to be moved by the third drive mechanism in a vertical direction perpendicular to the beam axis.

FIG. 5 shows a case where the tube length is largest. When the beam diameter is large, the second drive mechanism 11-12 moves the first member 11-3 and the second member 11-4 in such a manner that the tube length which is given by these may become short. If the beam diameter is small, on the other hand, it moves the first member 11-3 and the second member 11-4 in such a manner that the tube length which is given by these may become large. Preferably the second and third drive mechanisms 11-12 and 11-13 are also arranged to be driven as interlocked with the interchange drive device 63 by the controller described later.

The first through third drive mechanisms 11-11 through 11-13 are controlled in a feed-back manner by the controller 30 based on a measurement result which is obtained by a beam-diameter measurement portion which is constituted of a sensor comprised of a probe or a plurality of Faraday cups provided somewhere along the beam line, so that the moving distances of the first members 11-1 and 11-3 and the second members 11-2 and 11-4 may be adjusted. The interchange drive device 63 is also controlled by the controller 30. Of course, the first through third drive mechanisms 11-11 through 11-13 are arranged to be moved together with the combination of the arc chamber 10 and the shower tube 11 when it is moved by the interchange drive device 63.

As shown in FIG. 3 again, a power source is connected to a filament 10-1 of the arc chamber 10 in the same manner as shown in FIG. 3. That is, to the filament 10-1, a filament power source 57-2 and an arc power source 57-3 are connected. Furthermore, the arc chamber 10 is arranged so that a predetermined gas can be introduced into it from a gas supply system 57-4. The arc chamber 10, the shower tube 11, and the arc power source are each connected to the ground. However, the arc chamber 10 and the shower tube 11 are movable, so that each of gas supply line, electrical connection lines leading to the power sources, and the ground is intended to have flexibility in use.

In this example, furthermore, an intermediate tube 12 for prevention of beam divergence is mounted along the beam line between the shower tube 11 and the wafer 55. If the intermediate tube 12 is not mounted, in this region, the Faraday cup 58 which advances onto and retreats from the beam line may be arranged in the same configuration as that of FIG. 2. In this case, the combination of the arc chamber 10 and the shower tube 11 is mounted at such a position of the shower tube 11 as shown in FIG, 3 either in a condition where it is fixed or in such a movable configuration as described with reference to FIGS. 4 and 5.

Figure 6:
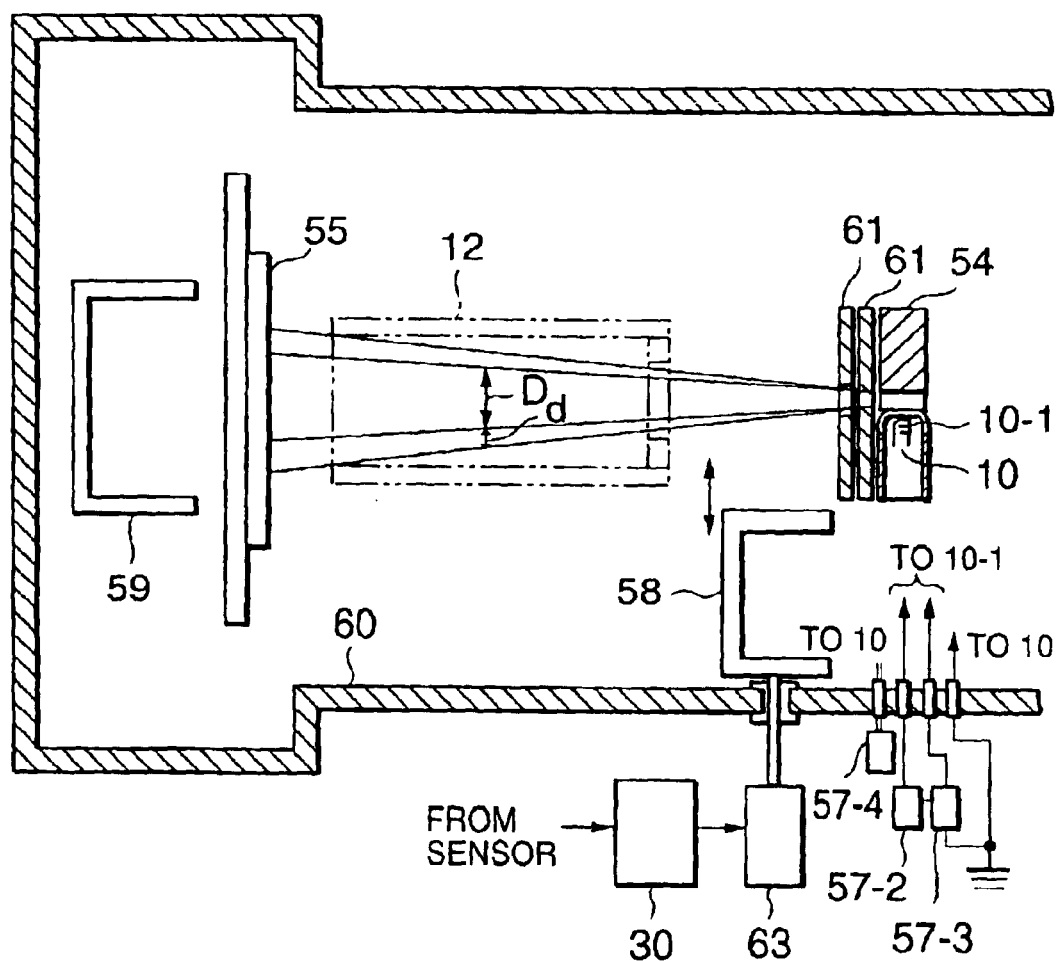
FIG. 6 is an illustration for showing a configuration of an ion implantation apparatus according to a second embodiment of the present invention on the downstream side of a resolving chamber.

FIG. 6 shows an ion implantation apparatus according to a second embodiment of the present invention. In the present ion implantation apparatus, an arc chamber 10 is mounted in a resolving aperture member 54. Accordingly, the quantity of electrons which are supplied from a plasma shower to an ion beam is influenced little by a variation in beam diameter. Therefore, there is no member provided which corresponds to the shower tube 11 described with reference to FIG. 3. A configuration of the upstream side of the resolving aperture member 54 is the same as that shown in FIG. 1.

In the present embodiment, a Faraday cup 58 is intended to be advanced onto and retreated from the beam line by the same drive device 63 as that of FIG. 2. Furthermore, a power source is connected to a filament 10-1 of an arc chamber 10 in the same manner as shown in FIG. 2. That is, to the filament 10-1, a filament power source 57-2 and an arc power source 57-3 are connected. Furthermore, the arc chamber 10 is arranged so that a predetermined gas can be introduced into it from a gas supply system 57-4. The arc chamber 10 and the arc power source are each connected to the ground. In this example, an intermediate tube 12 for prevention of beam divergence is mounted along the beam line between an aperture member 61 and a wafer 55. Of course, the intermediate tube 12 may be omitted.

In the ion implantation apparatus according to the present embodiment, an ion beam transported from an ion source is converged at the resolving aperture member 54. After passing through the resolving aperture member 54, the ion beam has its diameter increased again and is implanted into the wafer 55. Since an opening in the resolving aperture member 54 is made small originally, a variation in beam diameter at the resolving aperture member 54 is extremely small. The arc chamber 10 is mounted in the resolving aperture member 54 or in the immediate vicinity thereof, so that a variation in distance between the arc chamber 10 and the ion beam decreases as compared to a conventional case. As a result, the quantity of electrons which are supplied from a plasma shower to the ion beam is not influenced by the beam diameter.

In the ion implantation apparatus according to the first embodiment, when the ion beam is being set up, the Faraday cup 58 receives the ion beam. When the ion beam is set up completely and the Faraday cup 58 is moved off from the beam line, the ion beam is transported to the downstream side, to start implantation of ions into the wafer 55. At the same time, the Faraday cup moves to thereby place a plasma shower on the beam line, thus permitting it to function as a charge neutralization apparatus that is for restraining charge. That is, the plasma shower and the Faraday cup 58 share a space in the beam line, so that they can be interchanged with each other in use at a position where they are in good conditions. Moreover, it is possible to reduce the distance between the resolving aperture member 54 and the wafer 55, thus suppressing loss of a low-energy beam, in particular.

Furthermore, the arc chamber 10 and the shower tube 11 are arranged to be movable and, therefore, can be placed at a position near the beam diameter by measuring the beam diameter with the Faraday cup 58 each time ion implantation processing is carried out and controlling each of drive mechanisms with a controller 30 which receives a result of this measurement, to thereby adjust the position of the arc chamber 10 or the shower tube 11.

FIG. 7 shows dependency of an extraction current of a plasma shower on the beam diameter. The beam conditions are the same, with the beam diameter being adjusted by altering the parameters of the ion source. The value of the extraction current is indicated in a ratio with respect to a value assumed to be 1 when the beam diameter is large. Furthermore, the beam diameter is indicated in a value at the position of the wafer.

In the case of the conventional technology, as indicated by a broken line, the extraction current decreases with a decreasing beam diameter. In contrast, by the present invention, as indicated by a solid line, the extraction current varies little even when the beam diameter varies. That is, by reducing the distance between the arc chamber 10 and the ion beam, it is possible to obtain a stable extraction current which is not influenced by the beam diameter.

Although the present invention has been described with reference to the two embodiments, the present invention is not limited thereto and various modifications and additions can be conducted thereon. For example, a protection plate made of a carbon-based material etc. may be attached to the tip of the plasma chamber 10. By doing so, if an ion beam were to collide with the plasma chamber 10, the protection plate can protect the tip of the plasma chamber 10.

Furthermore, as the charge neutralization apparatus, the plasma shower may be replaced by any other element, for example, an electron shower as far as it utilizes the ion beam characteristics (positive potential) when electrons are extracted or supplied to the ion beam.

Furthermore, as the beam measurement portion, the Faraday cup may be replaced by a known beam profiler, a combination of a disk Faraday and a wafer disk having a spiral hole therein, a disk current measurement portion, etc. This means that the above-mentioned first through third drive mechanisms may be intended to be controlled by the controller 30 corresponding not only to the beam diameter but also to an ion beam intensity, cross section, or position or even the magnitude of an ion beam flight volume.

Furthermore, the shape of a hole in the resolving aperture member 54, that is, the shape of the aperture may come in a circle, an ellipsoid, a square, etc. The charge neutralization apparatus may be arranged on either a longer side or a shorter side of those which have different aspect ratios of the hole.

The present invention provides the following effects owing to such a configuration that the opening in the arc chamber of a plasma shower is arranged at a beam convergence position, that is, in the resolving aperture member or in the immediate vicinity of the downstream side thereof.

Since the opening in the resolving aperture member is made small, even if the beam condition varies due to a variation ascribed to the condition of the ion implantation apparatus, a variation in beam diameter in the resolving aperture member is extremely small, so that it is possible to obtain stable actions by arranging the plasma shower in the resolving aperture member or in the vicinity thereof.

By reducing the distance between the opening in the arc chamber of the plasma shower and the ion beam, it is possible to obtain a stable extraction current which is not influenced by the beam diameter.

Since the arc chamber of the plasma shower is mounted in the resolving aperture member or in the immediate vicinity thereof, a variation in distance between the arc chamber of the plasma shower and the ion beam decreases as compared to that by the conventional technology, so that the quantity of electrons which are supplied from the plasma shower to the ion beam is not influenced by the beam diameter.

Even when the beam diameter varies, the current extracted from the plasma shower varies little finally.

Furthermore, the present invention provides the following effects because the plasma shower and the beam measurement portion can be interchanged with each other at the same position on the beam line.

It is possible to reduce the focal distance, that is, the distance between the resolving aperture member and the wafer. That is, the plasma shower and the beam measurement portion share a space in the beam line. The space in the beam line can be switched in use between the plasma shower and the beam measurement portion, thus reducing the distance between the resolving aperture member and the wafer. As a result, loss in particular of a low-energy beam can be suppressed.

What is claimed is:

1. An ion implantation method comprising the steps of transporting an ion beam extracted from an ion sources, analyzing the extracted ion beam by a mass analysis magnet and a resolving aperture member to select required ion species, and implanting ions of the selected ion species into a processing-subject substrate, the ion beam passed through the resolving aperture member having an increasingly larger diameter, wherein the ion beam passing through a plasma shower system for neutralization of the charges in a transportation section on the upstream side of the processing-subject substrate and on the down stream side of the resolving aperture member.

wherein the plasma shower system is arranged at a position which is nearest the ion beam having the smallest diameter or an immediate vicinity position on the down stream side of said position.

2. The ion implantation method according to claim 1, wherein the position which is nearest the ion beam is in the resolving aperture member or the immediate vicinity position is an immediate vicinity position on the down stream side of the resolving aperture member.

3. The ion implantation method according to claim 1, wherein the plasma shower system is arranged at the immediate vicinity position on the down stream side of said position and, moreover, the position of the plasma shower system is variable corresponding to the beam diameter corresponding to the beam diameter.

4. The ion implantation apparatus according to claim 1, wherein the resolving aperture member for resolution and convergence of the ion beam is arranged on the upstream side of the plasma shower system and the immediate vicinity position is an immediate vicinity position on the down stream side of the resolving aperture member.

5. The ion implantation apparatus according to claim 4, wherein the plasma shower system includes a shower tube and an arc chamber which is combined with the shower tube and the shower tube has a small length in a beam axis direction so as not to contact with the ion beam.

6. The ion implantation method according to claim 5, wherein the shower tube has a minimum required inner diameter.

7. The ion implantation method according to claim 5, wherein an intermediate tube is arranged along a beam line between the shower tube and the processing-subject substrate in such a manner as to continue to the shower tube.

8. The ion implantation method according to claim 5, wherein a position of the arc chamber in a direction perpendicular to a beam axis is intended to be variable corresponding to a beam diameter or intensity.

9. The ion implantation method according to claim 5, wherein a position of the arc chamber in the beam axis direction is intended to be variable corresponding to a beam diameter or intensity, to thereby arrange the arc chamber at a position which is nearest the ion beam.

10. The ion implantation method according to claim 5, wherein a diameter of the shower tube is intended to be variable corresponding to a beam shape, position, or size.

11. The ion implantation method according to claim 5, wherein a length of the shower tube is intended to be variable corresponding to a beam shape, position, or size.

12. The ion implantation method according to claim 5, wherein a position of the shower tube in the beam axis direction is intended to be variable corresponding to a beam shape, position, or size.

13. The ion implantation apparatus according to claim 1, wherein in the transportation section on the upstream side of the processing-subject substrate is there arranged beam measurement means and, moreover, the beam measurement means and the plasma shower system are intended to be interchangeable with each other at the same position on a beam line.

14. The ion implantation method according to claim 2, wherein on the upstream side of the plasma shower system is there arranged a resolving aperture member for resolution and convergence of the ion beam and the position which is nearest the ion beam is in the resolving aperture member.

15. The ion implantation method according to claim 14, wherein on the downstream side of the resolving aperture member is there provided beam measurement means in such a manner as to advance onto and retreat from an ion beam line.

16. The ion implantation method according to claim 14, wherein on the downstream side of the resolving aperture member is there arranged an intermediate tube furthermore.

17. An ion implantation apparatus for transporting an ion beam extracted from an ion source and implanting ions of the ion beam into a processing-subject substrate, the ion implantation apparatus comprising a mass analysis magnet and a resolving aperture member for analyzing the extracted ion beam to select reguired ion species, the ion beam gassed through the resolving aperture member having an increasingly larger diameter.

wherein the ion beam passing through a plasma shower system for neutralization of the charges in a transportation section on the uPstream side of the processing-subject substrate and on the down stream side of the resolving aperture member, wherein the plasma shower system is arranged at a position which is nearest the ion beam having the smallest diameter or an immediate vicinity position on the down stream side of said position.

18. The ion implantation apparatus according to claim 17, wherein the position which is nearest the ion beam is in the resolving aperture member or the immediate vicinity position is an immediate vicinity position on the down stream side of the resolving aperture member.

19. The ion implantation method according to claim 17, wherein the plasma shower system is arranged at the immediate vicinity position on the down stream side of said position and, moreover, driving means is provided for making variable the position of the plasma shower system corresponding to the beam diameter.

20. The ion implantation apparatus according to claim 17, wherein the resolving aperture member for resolution and convergence of the ion beam is arranged on the upstream side of the plasma shower system and the immediate vicinity position is an immediate vicinity position on the down stream side of the resolving aperture member.

21. The ion implantation apparatus according to claim 20, wherein the plasma shower system includes a shower tube and an arc chamber which is combined with the shower tube and the shower tube has a small length in a beam axis direction so as not to contact with the ion beam.

22. The ion implantation apparatus according to claim 21, wherein the shower tube has a minimum required inner diameter.

23. The ion implantation apparatus according to claim 21, wherein an intermediate tube is arranged along a beam line between the shower tube and the processing-subject substrate in such a manner as to continue to the shower tube.

24. The ion implantation apparatus according to claim 21, wherein a position of the arc chamber in a direction perpendicular to a beam axis is intended to be variable corresponding to a beam diameter or intensity.

25. The ion implantation apparatus according to claim 21, wherein the drive means includes a drive mechanism for making variable a position of the arc chamber in the beam axis direction corresponding to a beam diameter or intensity, to thereby arrange the arc chamber at a position which is nearest the ion beam.

26. The ion implantation apparatus according to claim 21, wherein the shower tube is comprised of at least two members which are divided in the same direction as the beam axis direction in such a configuration that one of the at least two divided members has a little smaller cross section than the other and the drive means includes a drive mechanism for making variable a diameter of the shower tube by bringing close to or separate from each other the at least two divided members corresponding to a beam shape, position, or size.

27. The ion implantation apparatus according to claim 21, wherein the shower tube is comprised of at least two members which are divided in the same direction as the beam axis direction in such a configuration that one of the at least two divided members has a little smaller cross section than the other and the drive means includes a drive mechanism for making variable a length of the shower tube by moving at least one of the at least two divided members in a beam axial direction corresponding to a beam shape, position, or size.

28. The ion implantation apparatus according to claim 21, wherein the drive means includes a drive mechanism for making variable a position of the shower tube in the same direction as the beam axis direction corresponding to a beam shape, position, or size.

29. The ion implantation apparatus according to claim 17, wherein in the transportation section on the upstream side of the processing-subject substrate is there arranged beam measurement means and, moreover, an interchange drive device is provided for making the beam measurement means and the plasma shower system interchangeable with each other at the same position on a beam line.

30. The ion implantation apparatus according to claim 18, wherein on the upstream side of the plasma shower system is there arranged a resolving aperture member for resolution and convergence of the ion beam and the position which is nearest the ion beam is in the resolving aperture member.

31. The ion implantation apparatus according to claim 30, wherein on the downstream side of the resolving aperture member is there provided beam measurement means in such a manner as to advance onto and retreat from an ion beam line.

32. The ion implantation apparatus according to claim 30, wherein on the downstream side of the resolving aperture member is there arranged an intermediate tube furthermore.

* * * * *